United States Patent [19]

Matsuoka

[11] Patent Number: 5,717,162
[45] Date of Patent: Feb. 10, 1998

[54] IC CARRIER HAVING A MOVABLE AND STATIONARY CORNER RULERS

[75] Inventor: Noriyuki Matsuoka, Yokohama, Japan

[73] Assignee: Yamaichi Electronics Co., Ltd., Tokyo, Japan

[21] Appl. No.: 628,302

[22] Filed: Apr. 5, 1996

[30] Foreign Application Priority Data

Apr. 7, 1995 [JP] Japan ................................ 7-108062

[51] Int. Cl.⁶ ........................................ H01L 23/02
[52] U.S. Cl. ...................... 174/52.1; 174/52.4; 206/722
[58] Field of Search ............................. 206/722, 480, 206/724, 701, 706, 477, 486; 174/52.4, 52.3, 52.1; 361/728, 730, 732, 733

[56] References Cited

U.S. PATENT DOCUMENTS

| | | |
|---|---|---|
| 3,409,861 | 11/1968 | Barnes et al. . |
| 3,892,312 | 7/1975 | Tems . |
| 4,598,308 | 7/1986 | James et al. . |
| 4,692,790 | 9/1987 | Oyamada . |
| 4,718,548 | 1/1988 | Estrada et al. . |
| 4,747,483 | 5/1988 | Grabbe . |
| 4,881,639 | 11/1989 | Matsuoka et al. . |
| 4,886,169 | 12/1989 | Ayers et al. . |
| 4,918,513 | 4/1990 | Kurose et al. . |
| 4,933,747 | 6/1990 | Schroeder . |
| 5,066,245 | 11/1991 | Walker . |
| 5,070,389 | 12/1991 | Noriyuki . |
| 5,076,794 | 12/1991 | Ganthier . |
| 5,133,256 | 7/1992 | Keaton . |
| 5,139,437 | 8/1992 | Ikeya et al. . |
| 5,168,993 | 12/1992 | Yen . |
| 5,220,196 | 6/1993 | Michii et al. . |
| 5,238,110 | 8/1993 | Ye . |
| 5,289,032 | 2/1994 | Higgins, III et al. . |
| 5,296,741 | 3/1994 | Kim . |
| 5,309,326 | 5/1994 | Mioru . |
| 5,375,710 | 12/1994 | Hayakawa et al. ......... 206/331 |
| 5,389,820 | 2/1995 | Matsuoka . |
| 5,476,174 | 12/1995 | Uratsuji ......................... 206/722 |
| 5,493,150 | 2/1996 | Matsuoka et al. . |
| 5,494,169 | 2/1996 | Matsuoka ...................... 206/722 |
| 5,495,169 | 2/1996 | Smith . |
| 5,526,936 | 6/1996 | Matszoe ......................... 206/724 |

FOREIGN PATENT DOCUMENTS

| | | |
|---|---|---|
| 1-272142 | 10/1989 | Japan . |
| 2-36556 | 2/1990 | Japan . |
| 3-29903 | 6/1991 | Japan . |
| 7-22532 | 1/1995 | Japan . |

*Primary Examiner*—Kristine L. Kincaid
*Assistant Examiner*—Kristina Soderquist
*Attorney, Agent, or Firm*—Wenderoth, Lind & Ponack

[57] ABSTRACT

An IC career includes a movable corner ruler for regulating one of the two diagonally opposed corner portions which are situated on opposite corners of an IC, and a reference ruler for regulating the other corner portion. The movable ruler is resiliently retained by a first and a second plate spring extending along the two sides forming the first-mentioned corner portion of the IC such that the first-mentioned one corner portion is resiliently urged towards the reference corner ruler. The first and second plate springs are connected with each other through a connection piece integrally blanked together with the first and second plate springs, and internal ends of the first and second plate springs extend from connection portions with respect to the connection piece so as to define free ends.

9 Claims, 6 Drawing Sheets

IC CARRIER HAVING A MOVABLE AND STATIONARY CORNER RULERS

BACKGROUND OF THE INVENTION

1. Field of the Invention

This invention relates to an improvement of an IC carrier in which an IC is retained thereon with its diagonally opposing corner portions regulated by both movable and stationary corner rulers.

2. Brief Description of the Prior Art

An IC carrier disclosed in Japanese Patent Application Laid-Open No. 7-2253211995 includes a movable corner ruler for regulating one of the two diagonally opposed corner portions which are situated on opposite corners of an IC, and a reference corner ruler for regulating the other corner portion. The movable corner ruler is resiliently retained by a first and a second plate spring. The movable corner ruler is pushed by the resilient force of the plate springs to push the first-mentioned one corner portion of the IC such that the second-mentioned other corner portion of the IC is urged against the reference corner ruler, thereby retaining the IC between the two corner rulers.

The first and second plate springs are constituted of two separate elongated plates. A guide pin formed on an outer side surface of the movable corner ruler is slide fitted in an elongated groove which is formed in an internal end (i.e., that end toward the first-mentioned corner portion of the IC) of each plate spring, and an external end of each plate spring is press fitted in a carrier body.

The movable corner ruler is provided with a guide piece extending along a lower surface of the career body. The movement of the corner ruler is guided by this guide piece.

The construction of the above-mentioned prior art is such that two plate springs separately formed are mounted at external ends thereof on the carrier body by press fitting and the internal ends are contacted with the outer surface of the movable corner ruler through slide fitting of pins, respectively. However, the press-fitting attitudes of the plate springs and a relative relation with respect to the movable corner ruler are not well balanced. This prevents a smooth movement of the movable corner ruler and badly degrades the ruler performance.

Further, a procedure is required for separately press fitting the two plate springs to the carrier body. In addition, it is required to make two kinds of plate springs and take good care of them. Also, when the movable corner rulers are pushed at the back side by the two plate springs and moved, they tend to be inclined forwardly and downwardly. This, accompanied with the bad pushing attitudes of the springs, makes it more difficult to smoothly move the movable ruler.

SUMMARY OF THE INVENTION

The present invention has been accomplished in order to improve the abovementioned problems inherent in the conventional IC carrier. It is, therefore, an object of the present invention to provide an IC carrier in which an IC can be retained in a correct position.

Another object of the present invention is to provide an IC carrier which is simple in structure and easy to assemble.

In order to achieve the above object, there is essentially provided an IC carrier including a movable corner ruler for regulating one of the two diagonally opposed corner portions which are situated on opposite corners of an IC, and a reference ruler for regulating the other corner portion. The movable ruler is resiliently retained by a first and a second plate spring extending along two sides forming the first-mentioned corner portion such that the first-mentioned one corner portion is resiliently urged towards the reference corner ruler. The first and second plate springs are connected with each other through a connection piece which is integrally blanked together with the first and second plate springs, and internal ends of the first and second plate springs extend from connection portions with respect to the connection piece so as to define free ends.

It may be designed such that the connection piece extends diagonally across a lower surface of the movable corner ruler so that the movable corner ruler is guided to move between the connection piece and a carrier body.

According to this invention, the first plate spring and the second plate spring are interconnected through the connection piece and operated to act on the outer surface of the movable ruler. Accordingly, the first and second plate springs are correctly positioned relative to the movable corner ruler. As a consequence, it becomes possible to smoothly move the movable corner ruler by the first and second plate springs. Thus, the IC can be correctly positioned and retained by and between the movable corner ruler and the reference corner ruler by being urged at one corner portion of the IC.

Since the first and second plate springs are interconnected by the connection piece and integrally blanked into a unitary member (i.e., a unitary construction) in that state, the movable corner ruler can easily be attached to the first and second plate springs. Thus, the mounting procedure with respect to the carrier body becomes easy. In addition, manufacturing of the IC socket becomes easy and maintenance of the component parts becomes easy, too.

Further, the movable corner ruler can be horizontally moved in a stable manner between the connection piece and the carrier body. This, accompanied with the feature that the first and second plate springs are made into a unitary member, makes it possible to exhibit the ruler function in a more efficient manner.

The above and other objects and features of the present invention will become more manifest to those skilled in the art upon reading of the detailed description of the embodiment with reference to the accompanying drawings.

BRIEF DESCRIPTION OF THE DRAWINGS

FIG. 6(A) shows a state in which a movable corner ruler is in its original position, FIG. 6(B) is a state in which the movable corner ruler is retracted against the biasing force of a first and a second plate spring to form an enlarged IC receiving space between the first and second corner rulers, FIG. 6(C) shows a state in which an IC is received in the enlarged IC receiving space of FIG. 6(B) and FIG. 6(D) shows a state in which the movable corner ruler is further moved and the IC is correctly positioned;

DETAILED DESCRIPTION OF THE EMBODIMENT

Figure 1:
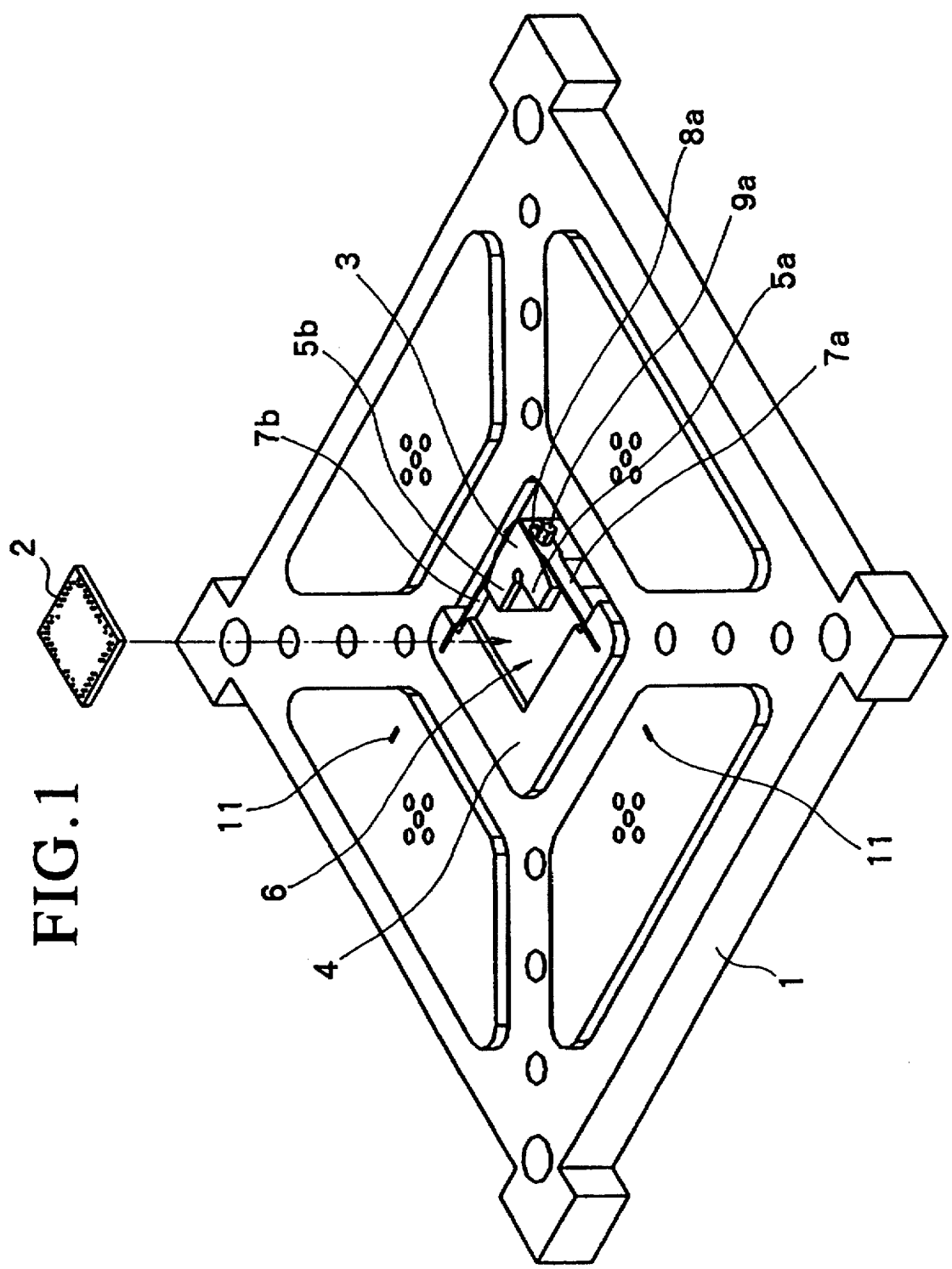
FIG. 1 is a perspective view of an IC carrier according to one embodiment of the present invention and an IC to be loaded thereon.

One embodiment of the present invention will now be described in detail with reference to the accompanying drawings.

Reference numeral 1 denotes a carrier body made of a generally square integrally molded insulative member. The carrier body 1 is provided with a movable corner ruler 3 for regulating one of diagonally opposed corner portions of an IC 2 and a reference corner ruler 4 for regulating the other corner portion of the IC 2.

Figure 5:
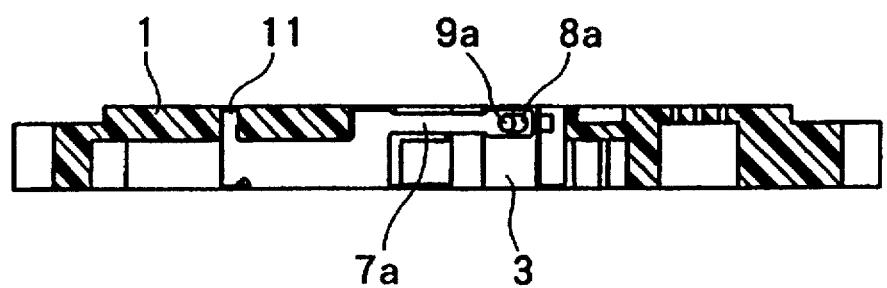
FIG. 5 is a sectional view taken on line V—V of FIG. 3.

The movable corner ruler 3 has a pair of ruler pieces 5a and 5b for regulating the two sides which define the first-mentioned corner portion of the IC 2. A plate spring 7a is disposed along one of the two sides which define the corner portion of the IC 2, and an external end of the spring 7a is fixedly press fitted in the carrier body 1. As shown in FIG. 5, an elongated groove 8a is formed in an internal end (i.e., that end towards the first-mentioned corner portion of the IC 2) of the spring 7a, and a guide pin 9a formed on and projecting from an outer side surface of the ruler piece 5a is slide fitted into the elongated groove 8a so that the movable corner ruler 3 is resiliently movably retained along one of the sides forming the corner portion of the IC 2.

Similarly, another plate spring piece 7 is disposed along the other of the two sides which define the corner portion of the IC 2, and the external end of the plate spring piece 7b is fixedly press fitted into the carrier body 1. Another guide pin 9b projecting from an outer side surface of the ruler piece 5b is slide fitted into an elongated hole 8b formed in an internal end of the spring piece 7b, so that the movable corner ruler 3 is resiliently movably retained along the other of the two sides which define the corner portion of the IC 2.

The first and second plate springs 7a and 7b are connected with each other by a connection piece 10 at an intermediate part in the longitudinal direction of each plate spring, i.e., between the support end which supports the movable corner ruler and the press fitting end which is press fit into the carrier body 1.

As shown in FIGS. 7(A), 7(B), 8(A) and 8(B), one end of the connection piece 10 is connected to a lower edge of the first plate spring 7a, and the other end is connected to a lower edge of the second plate spring 7b so as to be allowed to extend diagonally across a lower surface of the movable corner rule 3. That is, the connection piece 10 extends diagonally across an inner angle formed by the first and second plate springs 7a and 7b in order to interconnect the plate springs. The internal ends of the first and second plate springs 7a and 7b extend from the connection portions with respect to the connection piece 10 towards a side surface of the movable corner ruler 3 so as to define free ends, respectively.

The first and second plate springs 7a and 7b are formed by integrally blanking a metal plate and bending the same. Accordingly, the first and second plate springs 7a and 7b are interconnected by the connection piece 10 so as to provide a unitary structure.

Figure 7A:
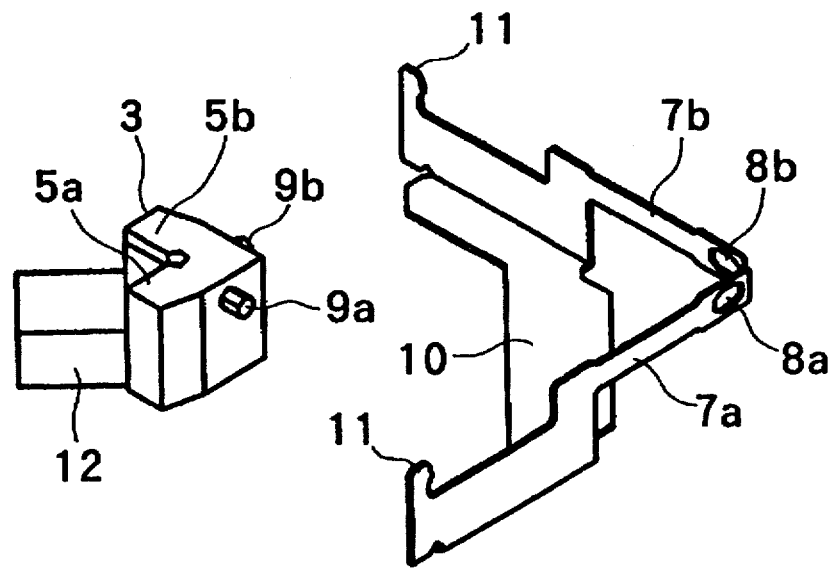
FIG. 7(A) is an exploded perspective view of the spring pieces and the movable corner ruler.
Figure 7B:
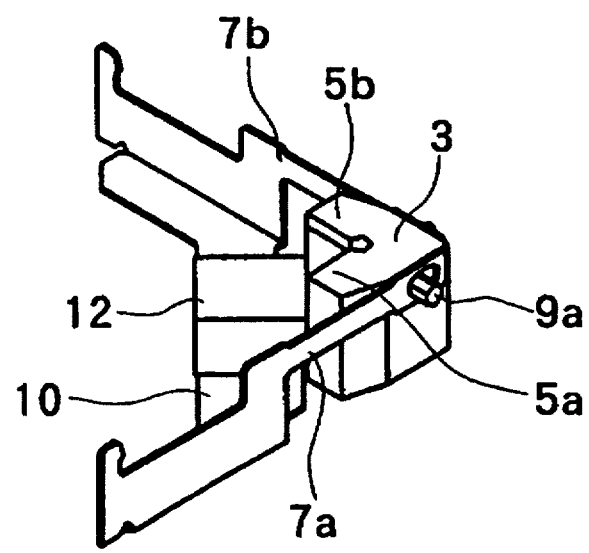
FIG. 7(B) is a perspective view showing an assembled state thereof.
Figure 8B:
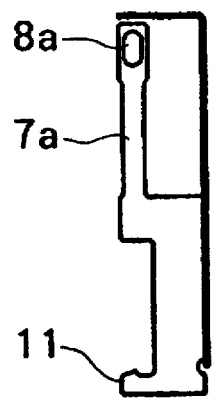
FIG. 8(B) is a side view thereof.
Figure 8A:
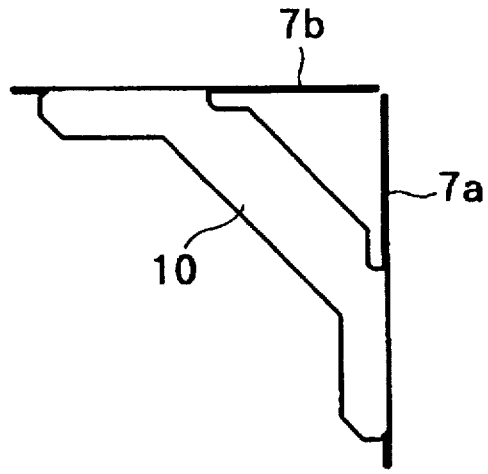
FIG. 8(A) is a bottom view of the plate springs.

As shown in FIG. 7(B), the movable corner ruler 3 is received in a space defined by internal ends of the first and second plate springs 7a and 7b, which form a unitary member, and supported by the connection piece 10. In that state, the movable corner ruler 3 is attached to the first and second plate springs 7a and 7b with the guide pins 9a and 9b slide fitted respectively into the elongated holes 8a and 8b. In that state, press-fit claws 11, which are formed integrally on external ends of the first and second plate springs 7a and 7b respectively by blanking, are fixedly press fitted into the carrier body 1. By doing this, the carrier body 1, the first and second plate springs 7a and 7b and the movable corner ruler 3 are assembled.

The claws 11 are raised upwardly from the external ends of the first and second plate springs 7a and 7b and then fixedly fitted into grooves formed in the carrier body 1 from the back side of the carrier body 1. By attaching the first and second plate springs 7a and 7b, and the movable corner ruler 3 to the carrier body 1, the movable corner ruler 3 is caused to be interposed between the connection piece 10 and the carrier body 1, so that the movable corner ruler 3 is guided between the connection piece 10 and the carrier body 1.

Figure 9A:
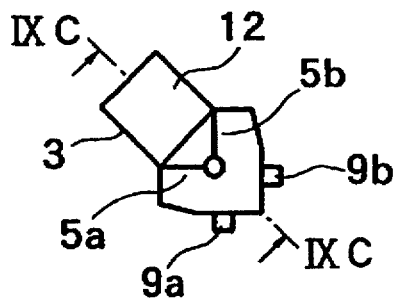
FIG. 9(A) is a plan view of the movable corner ruler.
Figure 9C:
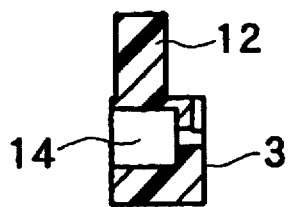
FIG. 9(C) is a sectional view taken on line IXC—IXC of FIG. 9(A).
Figure 9B:
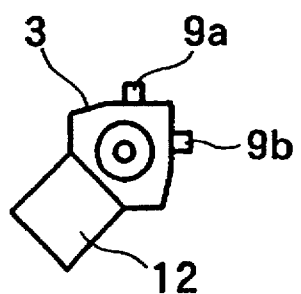
FIG. 9(B) is a bottom view thereof.

That is, as shown in FIGS. 9(A), 9(B) and 9(C), the movable corner ruler 3 is integrally formed with a guide piece 12 projecting inwardly. A lower surface of the guide piece 12 is supported by the connection piece 10 and an upper surface of the guide piece 12 is supported on a guide surface 13 disposed on the lower surface of the carrier body 1. In that state, the above-mentioned movement of the movable corner rule 3 is guided.

Figure 2:
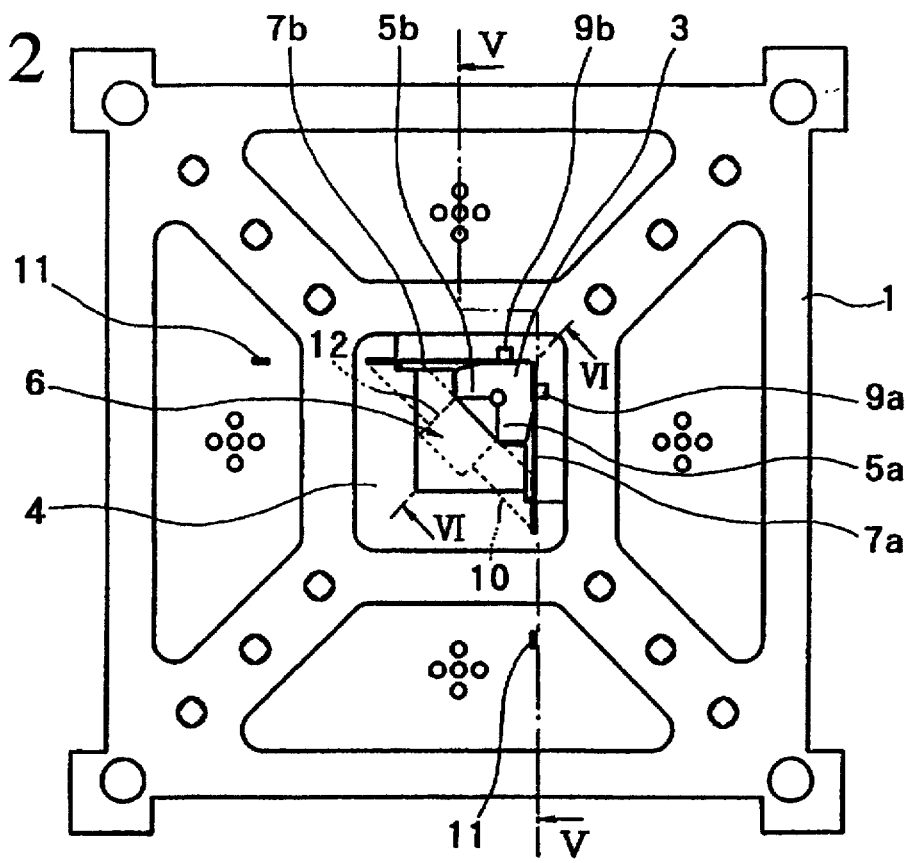
FIG. 2 is a plan view of the IC carrier.
Figure 3:
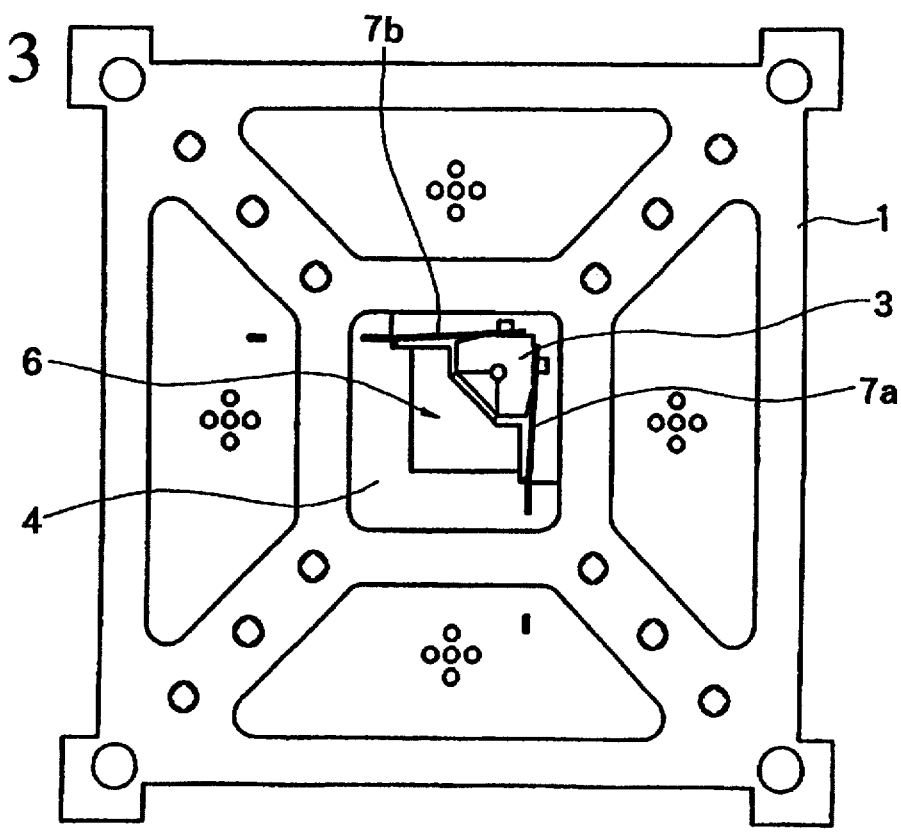
FIG. 3 is a plan view of the IC carrier but in which a movable corner ruler is in its retracted position.
Figure 6A:
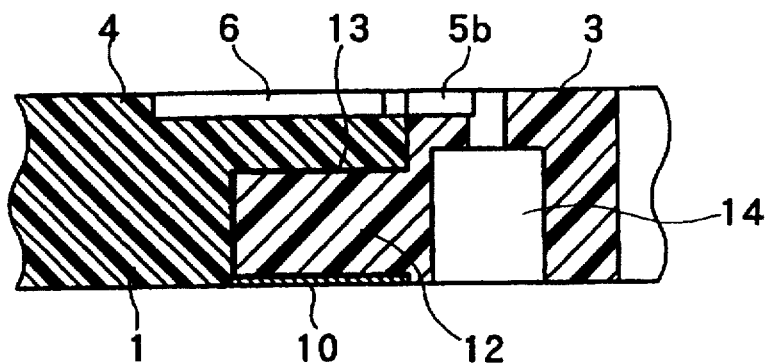
FIGS. 6(A)–6(D) are views taken on line VI—VI of FIG. 2, in which FIGS. 6(A) through 6(D) schematically depict a sequence of operation of the movable corner ruler in the IC carrier. Specifically.
Figure 6B:
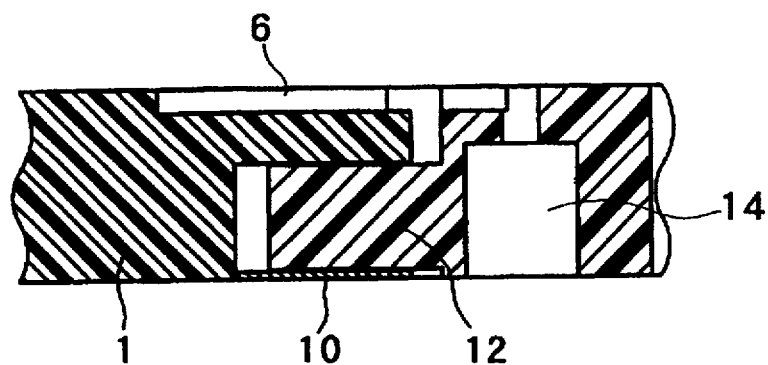
Figure 6C:
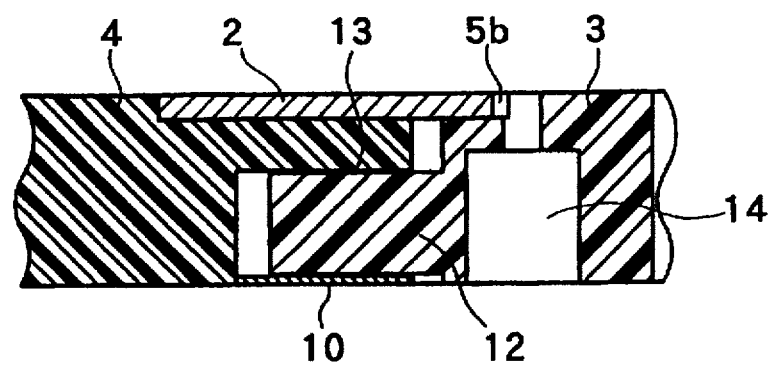

The guide piece 12 is provided on a lower surface thereof with a tool tip retainer 14. For controlling the movement of the movable corner ruler 3, a tool such as a driver or the like is inserted into the tool tip retainer 14. By retracting the movable corner rule 3 from the positions shown in FIGS. 1, 2 and 6A against the resilient force of the first and second plate springs 7a and 7b, an IC receiving space is enlarged between the first and second corner rulers 3 and 4 as shown in FIGS. 3 and 6B. In that state, the IC 2 is received in the IC receiving portion 6 formed between the first and second corner rulers 3 and 4 as shown in FIG. 6(C).

Figure 4:
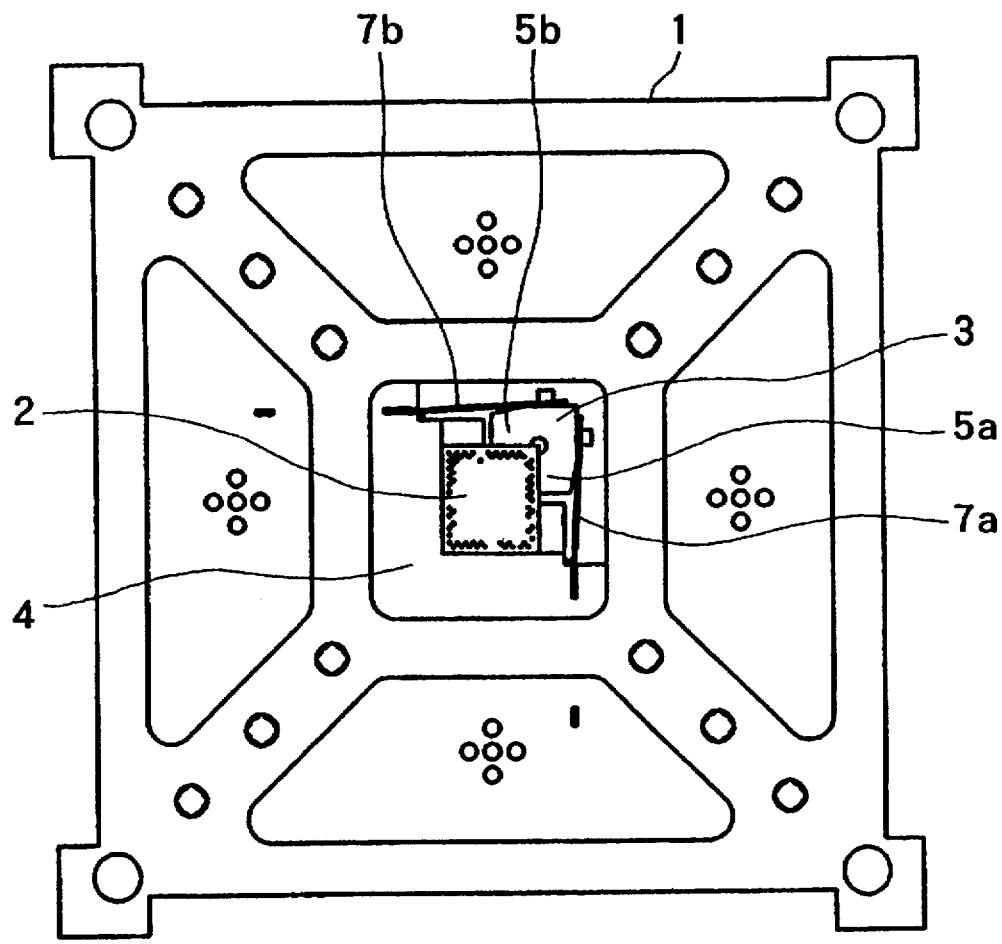
FIG. 4 is a plan view showing a state in which the IC is received in the IC carrier of FIG. 3.
Figure 6D:
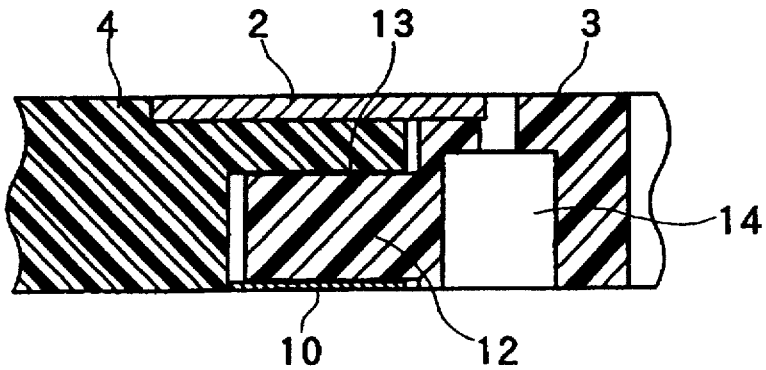

Next, as shown in FIGS. 4 and 6(D), when the movable corner ruler 3 is moved forwardly in accordance with the resilient force of the first and second plate springs 7a and 7b, the ruler pieces 5a and 5b press the two sides forming one of the diagonally opposing corner portions of the IC 2 so that the other corner portion of the IC 2 is urged against the reference corner ruler 4. By this, the IC 2 is correctly positioned and retained in the IC receiving portion 6 between the first and second corner rulers 3 and 4.

Outward deflection of the internal ends of the first and second plate springs 7a and 7b about the connection portion with respect to the connection piece 10 allows a retraction of the movable corner ruler piece 3, and restoring force thereof causes the movable corner ruler 3 to move forwardly so as to press the corner portion of the IC 2.

The movable corner ruler 3 is movable in a direction along the two sides forming the corner portion of the IC 2 within an allowable range of the elongated holes 7a and 7b of the first and second plate springs 7a and 7b. Owing to this arrangement, the movable corner ruler 3 is moved in accordance with the change of the position of the corner portion of the IC 2 and appropriately regulates the corner portion of the IC 2 by the ruler pieces 5a and 5b.

In the above-mentioned embodiment, the elongated holes 8a and 8b are formed respectively in the internal ends of the plate springs 7a and 7b, and the pins 9a and 9b formed on the movable corner ruler 3 are slide fitted respectively into the elongated holes 8a and 8b. In the alternative, the elongated holes 8a and 8b may be eliminated such that the internal ends of the plate springs 7a and 7b are merely contacted with the outer side surface of the movable corner ruler 3.

As described previously, the movable corner ruler 3 is designed such that its guide piece 12 is slidably held between the connection piece 10 and the carrier body 1. Accordingly, the support by the elongated holes 8a and 8b and the pins 9a and 9b can be omitted.

According to the present invention, the relative position of the first spring and the second spring with respect to the movable corner ruler is correctly established by the connection piece, a smooth movement of the movable corner ruler is ensured by the first and second plate springs, and the IC can be correctly positioned and retained between the movable corner ruler and the reference corner ruler.

In addition, the first and second plate springs are of a unitary structure obtained by being blanked integrally together with the connection piece. Accordingly, the movable corner ruler can easily be attached to the first and second plate springs. Thus, the mounting procedures with respect to the carrier body becomes easy. In addition, manufacturing of the IC socket becomes easy and maintenance of the component parts becomes easy, too.

Further, the movable corner ruler can be horizontally moved in a stable manner between the connection piece and the carrier body. This, accompanied with the feature that the first and second plate springs are made into a unitary member, makes it possible to exhibit the ruler function in a more efficient manner.

What is claimed is:

1. An IC carrier for use with an IC having first and second diagonally opposed corner portions and first and second sides defining the first corner portion, said IC carrier comprising:

a movable corner ruler for regulating the first corner portion of the IC;

a reference corner ruler for regulating the second corner portion of the IC;

first and second plate springs resiliently retaining said movable corner ruler and for extending along the first and second sides of the IC such that said movable corner ruler is resiliently urged toward said reference corner ruler; and wherein said first and second plate springs are connected with each other through a connection piece, and said first and second plate springs have free ends extending toward each other from locations where said first and second plate springs connect with said connection piece, respectively.

2. An IC carrier as recited in claim 1, wherein said connection piece is integrally blanked with said first and second plate springs.

3. An IC carrier as recited in claim 2, wherein said connection piece extends across a lower surface of said movable corner ruler.

4. An IC carrier as recited in claim 2, further comprising a carrier body; and wherein said connection piece extends across a lower surface of said movable corner ruler, and said movable corner ruler is guided for movement between said connection piece and said carrier body.

5. An IC carrier as recited in claim 1, wherein said connection piece is integral with said first and second plate springs.

6. An IC carrier as recited in claim 5, wherein said connection piece extends across a lower surface of said movable corner ruler.

7. An IC carrier as recited in claim 5, further comprising a carrier body; and wherein said connection piece extends across a lower surface of said movable corner ruler, and said movable corner ruler is guided for movement between said connection piece and said carrier body.

8. An IC carrier as recited in claim 1, wherein said connection piece extends across a lower surface of said movable corner ruler.

9. An IC carrier as recited in claim 1, further comprising a carrier body; and wherein said connection piece extends across a lower surface of said movable corner ruler, and said movable corner ruler is guided for movement between said connection piece and said carrier body.

* * * * *